United States Patent [19]

Montgomery

[11] Patent Number: 5,766,362
[45] Date of Patent: Jun. 16, 1998

[54] APPARATUS FOR DEPOSITING BARRIER FILM ON THREE-DIMENSIONAL ARTICLES

[75] Inventor: David B. Montgomery, Cary, N.C.

[73] Assignee: Becton Dickinson and Company, Franklin Lakes, N.J.

[21] Appl. No.: 724,488

[22] Filed: Sep. 30, 1996

[51] Int. Cl.⁶ .................................................. C23C 16/00
[52] U.S. Cl. .................................... 118/723 E; 118/728
[58] Field of Search ........................... 118/723 E, 728; 156/345

[56] References Cited

U.S. PATENT DOCUMENTS 3,057,795 10/1962 Frohlich ................... 118/723 E X
4,971,667 11/1990 Yamazaki et al. ............ 118/723 E X
5,611,862 3/1997 Lee et al. ..................... 118/723 E

*Primary Examiner*—Thi Dang
*Attorney, Agent, or Firm*—Bruce S. Weintraub

[57] ABSTRACT

The invention relates to an apparatus for use in a Plasma Enhanced Chemical Vapor Deposition (PECVD) process whereby a coating of inorganic material is deposited on three-dimensional articles, including low melting temperature polymer articles. The coating possesses excellent gas and/or water vapor barrier properties.

6 Claims, 3 Drawing Sheets

APPARATUS FOR DEPOSITING BARRIER FILM ON THREE-DIMENSIONAL ARTICLES

FIELD OF THE INVENTION

The invention relates to an apparatus for use in a Plasma Enhanced Chemical Vapor Deposition (PECVD) process whereby a coating of inorganic material is deposited on three-dimensional articles, including low melting temperature polymer articles. The coating possesses excellent gas and/or water vapor barrier properties.

BACKGROUND OF THE INVENTION

With the increased emphasis on the use of plastic medical products, a special need exists for improving the barrier properties of articles made of polymers.

Such medical products that would derive a considerable benefit from improving their barrier properties include, but are not limited to, collection tubes and particularly those used for blood collection. Additionally, such improvement of barrier properties of articles made of polymers can also have applications with respect to food, cosmetics and the like.

With respect to, for example, collection tubes, blood collection tubes require certain performance standards to be acceptable for use in medical applications. Such performance standards include the ability to maintain greater than about 90% original draw volume over a one year period, to be radiation sterilizable and to be non-interfering in tests and analysis.

Therefore, a need exists to improve the barrier properties of articles made of polymers and in particular plastic evacuated blood collection tubes wherein certain performance standards would be met and the article would be effective and usable in medical applications.

Glass-like or metal oxide films synthesized from chemical vapor deposition techniques have been used as thin barrier coatings on polypropylene films. However, glass-like thin films that are synthesized are substantially granular in morphology instead of substantially continuously glass-like and therefore do not have the oxygen and water vapor barrier characteristics of a truly continuous glass material.

It has been shown that to overcome the drawbacks of the morphology of glass-like thin films is to "stack" layers of glass-like films with a continuous organic polymer film interposed between each layer. Such laminar multilayer coatings improve the oxygen barrier performance of polypropylene films, however such layering does not produce a glass-like barrier and the layering merely performs as a laminate of metal oxides and acrylate polymer coatings.

It is therefore desirable to produce a composite that may be used to achieve gas and water barrier performance similar to glass.

Generally, existing processes which are used for producing PECVD barrier films are suited mainly for 2-D surfaces. Those which have been developed for 3-D articles are not well suited for scale-up in high loading density matrix treatments. The process of the present invention is well suited for such scale-up.

SUMMARY OF THE INVENTION

The present invention relates to an apparatus and process for applying a plasma assisted chemical vapor deposited barrier film coating to the exterior wall surfaces of two or more three-dimensional articles (such as hollow articles) comprising:

a) providing an apparatus capable of applying said barrier film coatings to exterior walls of said articles, said apparatus having: a vacuum tight chamber, means for delivering a monomer to said articles; a means for delivering an oxidizer to said articles; a means for inserting radio frequency powered electrodes inside the inner surface of said articles; at least two electrodes therein; a means for creating and maintaining a vacuum inside said chamber containing said articles; and further wherein said apparatus is mounted on a pumping station, and wherein said chamber is attached to a means for importing energy inside said article wherein said means is a radio frequency power generator;

b) positioning at least two three dimensional articles having an open end, a closed end, an exterior, an interior and an external and internal wall surface so that said open end is placed over the said at least one electrode;

c) evacuating said chamber containing said articles to below 5 mTorr;

d) delivering a monomer gas to said exterior surfaces of said article from about 1 sccm to 5 sccm and from about 80 mTorr to 160 mTorr;

e) delivering an oxidizer gas to said exterior surfaces from about 50 to 150 sccm and from about 80 mTorr to 160 mTorr;

f) delivering a radio frequency power to said electrodes of about 1 to 50 MHz and from about 0.1 to 2 watts/cm$^2$; and g) obtaining barrier film coatings on said article at a rate of 40 to 100 nm/min.

DETAILED DESCRIPTION OF THE INVENTION

The present invention is directed to an apparatus for use in a PECVD process whereby a coating of inorganic material may be placed on 3-D articles in a closely spaced matrix. This inorganic material can be a metal oxide such as SiOx wherein x is from about 1.4 to about 2.5; or an aluminum oxide based composition. The silicon oxide based composition is substantially dense and vapor-impervious and is desirably derived from volatile organosilicon compounds and an oxidizer such as oxygen or nitrous oxide. Preferably, the thickness of the silicon oxide based material is about 50 to 400 nm.

Figure 1:
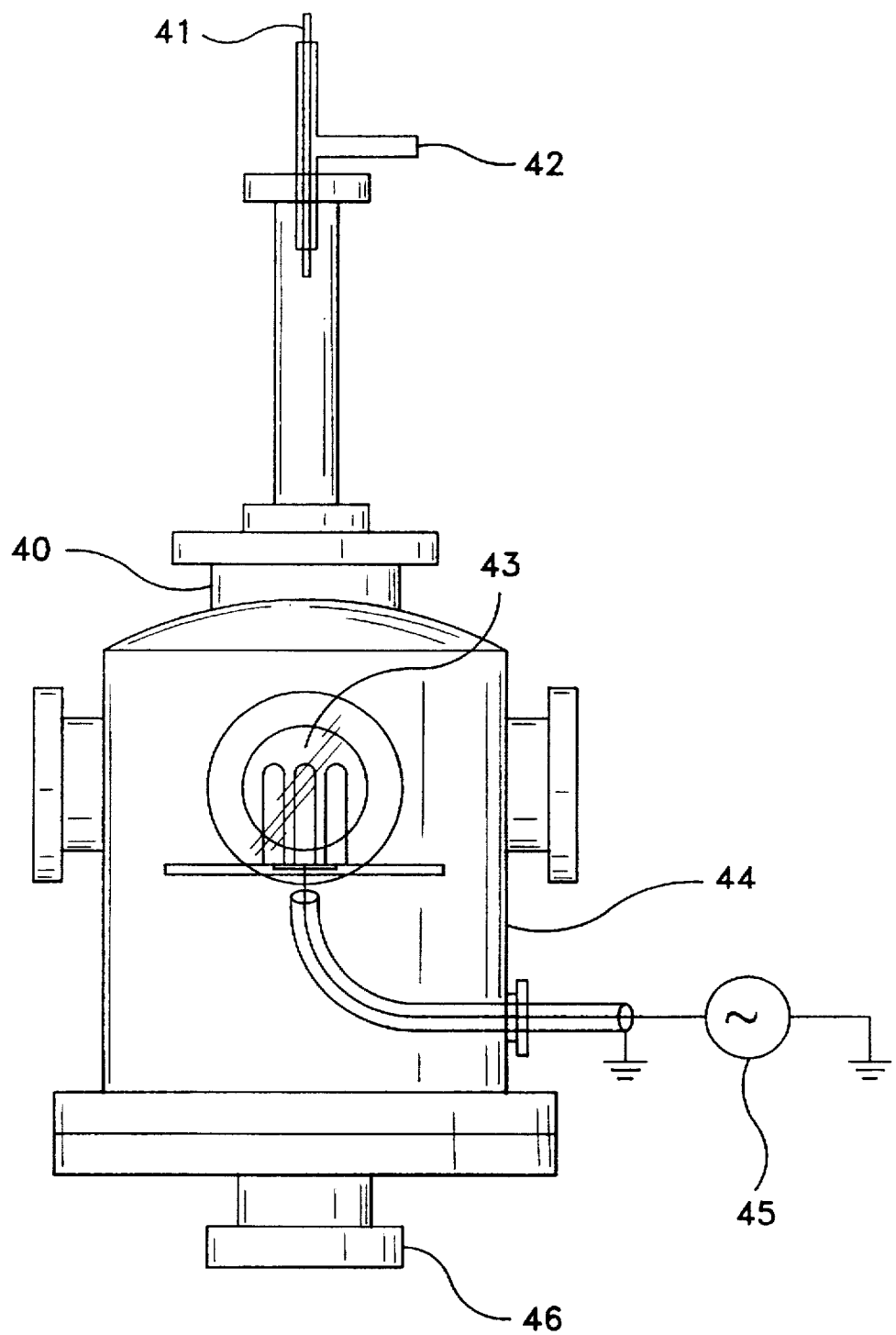
FIG. 1 is a general schematic view of an apparatus of the present invention.

FIG. 1 shows a schematic of an apparatus 40 relative to an embodiment of the present invention. In use, polymer tubes are placed over the electrodes 43 and the chamber 44 is evacuated to a base pressure, preferably below 5 mTorr. An organosilicon vapor (such as HMDSO (hexamethyldisiloxane)) and an oxidizer (such as oxygen) are admitted into the apparatus by 41 and 42, respectively. For a system of approximately 12 inches diameter with vertical flow, an HMDSO flow of about 1 to 5 sccm and an oxygen flow of about 50 to 150 sccm is used. The system is pumped continuously at a rate to maintain a pressure of about 80 to 160 mTorr. The apparatus is mounted on a pumping station 46.

A radio frequency (RF) power generator and matching system 45 is used to generate a plasma with a frequency of about 1 to 50 MHz and a power per electrode area of about 0.1 to 2 watts/cm$^2$ depending upon the number and proximity of the electrodes. A deposition of SiOx thus occurs upon the exposed article at a rate on the order of 40 to 100 nm/min. Significant barrier properties may be realized with coating of 50 to 400 nm thickness.

During deposition, electrode potentials oscillate with an amplitude of about 500 v to 1000 v peak-to-peak for RF frequencies of about 5 to 15 MHz. For a given RF power amplitudes decrease with increasing frequency and increase with decreasing frequency. If the matching network includes a blocking capacitor and if a portion of the electrode circuit is exposed to the plasma, an electron current from the plasma establishes a negative DC bias on the electrodes of about −100 v to −400 v. This bias may be reduced or essentially eliminated by minimizing the area of the electrode circuit exposed to the plasma and/or by shorting out the DC component of the electrode potential through an inductor which blocks RF current.

Optimum barrier occurs for deposition conditions which deliver an element of energy to the polymer article just short of causing thermal degradation. This absorbed energy is a product of treatment time, ion current, and the electrical potential in the plasma sheath which accelerates these ions. Since the process take place under vacuum, little heat conduction or convection occurs and almost all absorbed energy is retained.

Figure 2A:
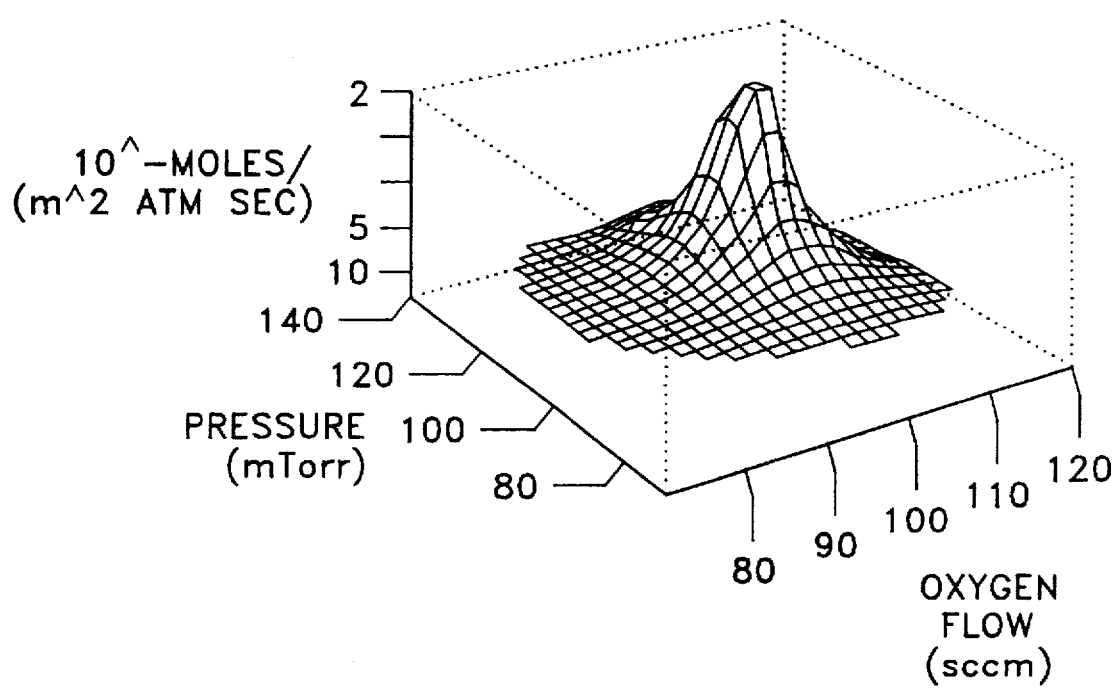
FIG. 2a–b is a graphical representation of the permeance of coated polystyrene as a function of pressure (mTorr) vs. oxygen flow (sccm) during plasma deposition.
Figure 2B:
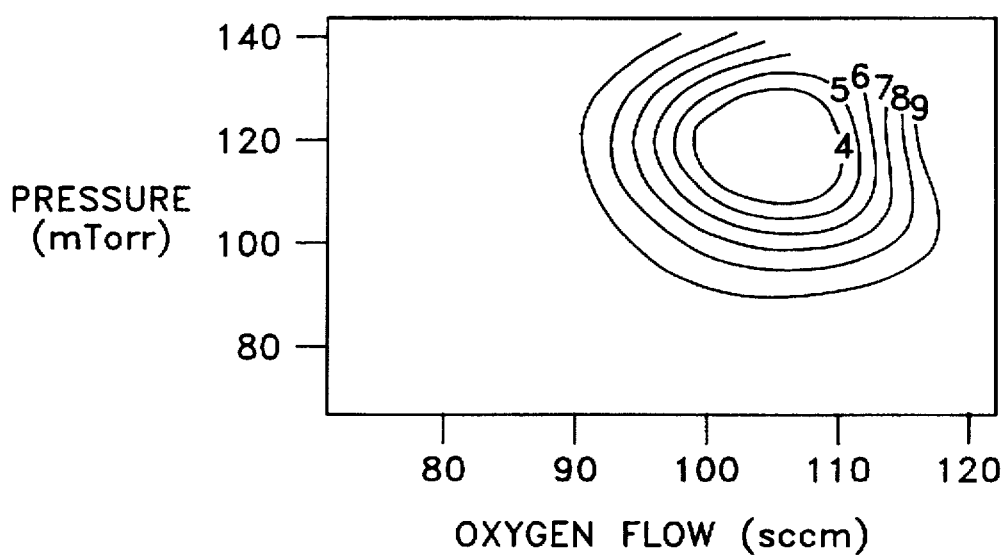

In order to produce a high quality barrier film, such as SiOx barrier film, a narrow range of both physical and chemical properties must be satisfied. Failure on either count will result in a highly permeable film. Response surfaces plotting oxygen barrier properties against plasma deposition process parameters (see FIG. 2) show optimum barrier occurs for only a small zone in matrix space for oxygen and HMDSO flow rates and system pressure. Outside of this range, soft polymer-like films occur for excessive monomer, highly stressed and fractured films occur for excessive oxygen, slow deposition rates occur for low pressure, and gas phase nucleation leading to powdery deposits occur for high system pressure.

Even with proper chemistry, poor barrier will result without proper ion bombardment of the film during deposition. The electric field near the substrate surface is key to increasing deposition rate and most important identifying the film by ion bombardment to eliminate microvoids and granular structure. However, excessive ion energy can thermally destroy the film. Balancing these requirements demands a proper combination of total number of electrodes, spacing between electrodes, RF frequency, RF power, and coupling of the plasma to a grounded conductor.

The RF power delivered to an electrode simultaneously generates the RF plasma discharge surrounding the polymer article and produces an electric field which accelerates ions toward the surface. The discharge is responsible for causing reactive species to form which can combine into the film. The electric field independently densifies the deposited material into an impermeable film. There is no assurance that for a given system geometry both processes can properly take place simultaneously; indeed examples exist where no barrier can be achieved throughout process space.

The discharge formed around an electrode is most intense at a distance of about 0.3 to 2 cm and falls off in density at greater distances. When additional electrodes are arranged into a matrix with separations of a few cm or less, such as, for example, 0.5 to 15 cm, these discharge zones overlap and the plasma density near any electrode is enhanced by the effect of its neighbors. This allows a lower RF power to be used to achieve a given plasma density which may be needed for generating the required reaction chemistry. As was mentioned earlier, the electrode potential which controls the sheath fields is dependent on RF power and frequency. The plasma potential is influenced by the above factors and additionally by the flow of charged species to any nearby conductive surface, such as a grounded chamber wall. Thus, a successful system demands a carefully matched set of process parameters as well as design geometry.

The present invention may be embodied in a variety of forms depending on the size and shape of the articles to be coated.

Figure 3:
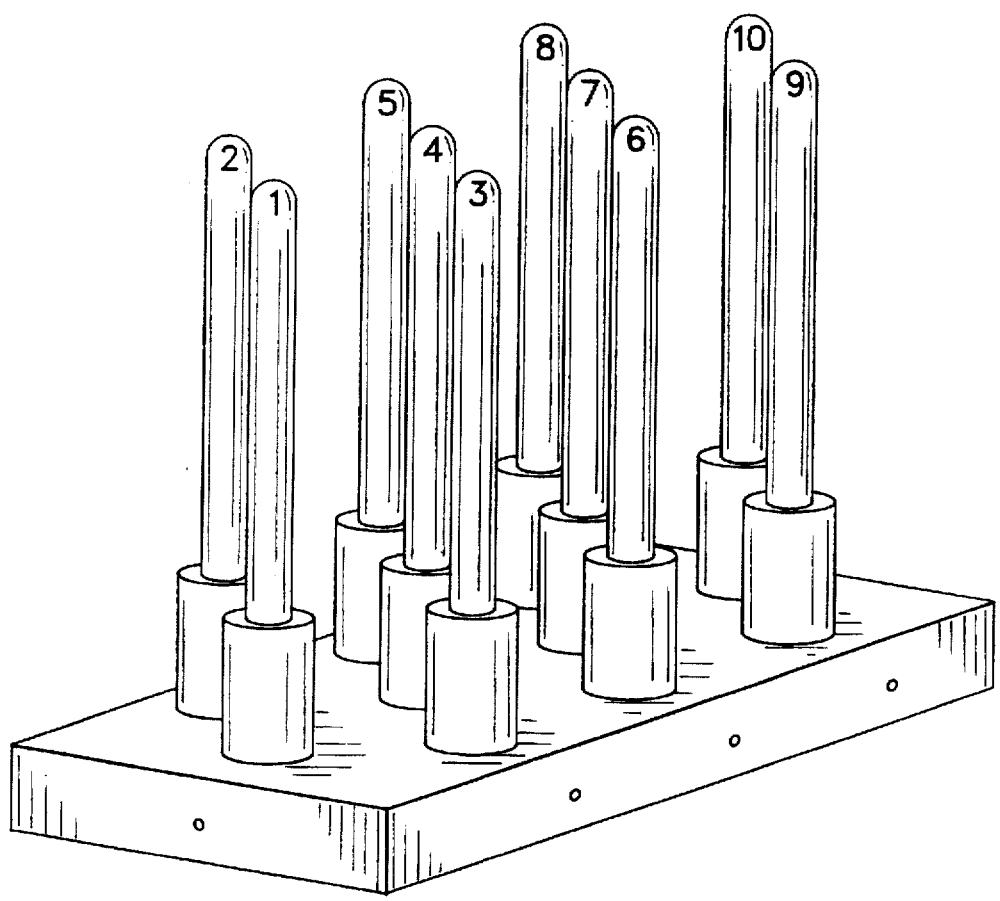
FIG. 3 is a three-dimensional representation of an embodiment in which there are 10 electrodes and the electrode locations are shown, and this matrix of electrodes can be utilized in the apparatus of FIG. 1.

For the case of small cylindrical containers, the following is a preferred configuration which can be used in the apparatus of FIG. 1. Ten electrodes which fit inside 13×100 mm PET tubes are arranged in a matrix as shown in FIG. 3. The electrodes have location numbers 1–10. Center to center distance of separation in this instance is 4 cm but is in no way limited thereto. A flow of 2.6 sccm HMDSO and 70 sccm oxygen is established and pressure regulated to 120 mTorr by pump throttling. A 3 min SiOx deposition is produced with an 11.9 MHz 120 watt RF excitation. The electrodes experience a 770 v p-p RF amplitude with a DC bias of −230 v. Since these tubes have approximately a 40 cm$^2$ surface area, this results in a 0.3 w/cm$^2$ power loading. This treatment yields an improved gas and water vapor barrier of approximately 3 times that of an untreated 1 mm thick PET tube.

None of the above parameters are independent of each other. For instance, fewer or more widely spread electrodes require a higher power per area to produce barrier; for only four tubes used at the outside corners of the existing matrix, i.e., electrodes #2, 3, 8 and 9 in FIG. 3, as power is increased to produce an adequate plasma density, thermal degradation occurs before comparable barrier is attained. In this case a 915 v p-p electrode amplitude is not capable of equaling the deposition produced with the 770 vp-p ten electrode arrangement. Furthermore, the DC bias which has been widely discussed in the publications on film deposition by PECVD such as Gibson, *Mat. Res. Soc. Symp. Proc.*, 223 (1991) and Green, *Mat. Res. Soc. Symp. Proc.*, 165 (1990) as being key to ion bombardment, has been shown herein to be irrelevant: by connecting the electrode circuit to an 8000 μH inductor shorted to ground, this bias may be reduced completely to zero without loss or barrier. By inserting resistors in series with the inductor, the bias may be reduced by steps. As this occurs, the plasma potential shifts positive, and the surface charge on the substrate alters to maintain sheath potential.

EXAMPLES

Example I

Using the arrangement of the preferred embodiment, a treatment was produced with identical gas flows, pressure, and RF frequency and tuning, but at a power of 148 watts for 2 min. This treatment gave a water barrier of approximately 2.5× that of the untreated tube.

Example II

Another example is a treatment identical to the above, except that a 1 min 167 watt plasma was used. A 1.7× improvement in water barrier was achieved.

What is claimed is:

1. An apparatus capable of applying a plasma assisted chemical vapor deposited barrier film coating to the exterior wall surfaces of two or more three dimensional articles, said apparatus comprising:

a vacuum tight chamber;

a means for delivering a monomer to said articles;

a means for delivering an oxidizer to said articles;

a means for inserting radio frequency powered electrodes inside the inner surface of said articles;

at least two electrodes;

a means for creating and maintaining a vacuum inside said chamber containing said articles;

a means for containing the above elements in said vacuum tight chamber; and further wherein said apparatus is mounted on a pumping station; and wherein said chamber is attached to a means for importing energy inside said articles wherein said means is a radio frequency power generator.

2. The apparatus of claim 1 wherein said vacuum chamber is in close proximity to a plasma discharge which is generated around the electrodes and three dimensional articles or wherein said vacuum chamber is in close proximity to a grounded surface.

3. The apparatus of claim 1 wherein said apparatus has at least ten electrodes and a means for holding said electrodes.

4. The apparatus of claim 1 wherein said apparatus has at least twenty electrodes and a means for holding said electrodes.

5. The apparatus of claim 3 wherein said electrodes are spaced apart at a distance of about 0.5 to 15 cm.

6. The apparatus of claim 4 wherein said electrodes are spaced apart at a distance of about 0.5 to 15 cm.

* * * * *